United States Patent
Graumann (10) Patent No.: US 12,014,068 B2
(45) Date of Patent: Jun. 18, 2024

(54) SYSTEM AND METHOD FOR DOUBLE DATA RATE (DDR) CHIP-KILL RECOVERY

(71) Applicant: Microchip Technology Inc., Chandler, AZ (US)

(72) Inventor: Peter John Waldemar Graumann, Calgary (CA)

(73) Assignee: Microchip Technology Inc., Chandler, AZ (US)

( * ) Notice: Subject to any disclaimer, the term of this patent is extended or adjusted under 35 U.S.C. 154(b) by 244 days.

(21) Appl. No.: 17/671,423

(22) Filed: Feb. 14, 2022

(65) Prior Publication Data
US 2022/0342582 A1  Oct. 27, 2022

Related U.S. Application Data

(60) Provisional application No. 63/180,615, filed on Apr. 27, 2021.

(51) Int. Cl.
*G06F 3/06* (2006.01)

(52) U.S. Cl.
CPC .......... *G06F 3/0652* (2013.01); *G06F 3/0619* (2013.01); *G06F 3/0673* (2013.01)

(58) Field of Classification Search
CPC .... G06F 3/0652; G06F 3/0619; G06F 3/0673; G11C 29/44
See application file for complete search history.

(56) References Cited

U.S. PATENT DOCUMENTS

| | | | |
|---|---|---|---|
| 6,119,260 A * | 9/2000 | Tomisawa | G11B 20/1813 |
| 7,415,584 B2 | 8/2008 | Gibb et al. | |
| 7,428,564 B2 | 9/2008 | Gibb et al. | |
| 8,196,024 B2 | 6/2012 | Asirvatham et al. | |
| 8,386,870 B2 | 2/2013 | Graumann | |
| 8,509,073 B2 | 8/2013 | Bourlas et al. | |
| 8,594,135 B2 | 11/2013 | Porat et al. | |
| 8,625,498 B2 | 1/2014 | Bourlas et al. | |
| 8,631,309 B2 | 1/2014 | Graumann et al. | |
| 8,639,998 B2 | 1/2014 | Graumann | |
| 8,679,845 B2 | 3/2014 | Maizels et al. | |
| 8,689,074 B1 | 4/2014 | Tai | |
| 8,769,380 B1 | 7/2014 | Burd et al. | |
| 8,892,976 B2 | 11/2014 | Graumann | |
| 8,938,037 B1 | 1/2015 | Fard et al. | |
| 8,971,396 B1 | 3/2015 | Bates et al. | |
| 8,984,376 B1 | 3/2015 | Norrie | |
| 9,009,565 B1 | 4/2015 | Northcott et al. | |

(Continued)

OTHER PUBLICATIONS

PCT/US2022/017289, International Search Report and Written Opinion, European Patent Office, mailed Jun. 1, 2022.

(Continued)

*Primary Examiner* — Eric T Loonan
(74) *Attorney, Agent, or Firm* — Glass & Associates; Kenneth Glass; Molly Sauter (57) ABSTRACT

A system and method for double data rate (DDR) chip-kill decoding using an array of ECC erasure decoders operating in parallel to identify a location of a chip-kill event associated with a DDR memory device. The ECC erasure decoder that correctly identifies the chip-kill location is then used to decode subsequent DDR bursts transmitted from the DDR memory device.

20 Claims, 5 Drawing Sheets

(56) References Cited

U.S. PATENT DOCUMENTS

| | | | |
|---|---|---|---|
| 9,021,333 B1 * | 4/2015 | Northcott | G06F 11/073 714/766 |
| 9,026,867 B1 | 5/2015 | Northcott et al. | |
| 9,053,012 B1 | 6/2015 | Northcott et al. | |
| 9,081,701 B1 | 7/2015 | Northcott et al. | |
| 9,166,623 B1 | 10/2015 | Bates et al. | |
| 9,170,876 B1 | 10/2015 | Bates et al. | |
| 9,208,018 B1 | 12/2015 | Northcott et al. | |
| 9,325,347 B1 | 4/2016 | Graumann et al. | |
| 9,432,053 B1 | 8/2016 | Graumann et al. | |
| 9,467,172 B1 | 10/2016 | Graumann et al. | |
| 9,473,175 B1 | 10/2016 | Graumann et al. | |
| 9,479,297 B2 | 10/2016 | Graumann | |
| 9,524,210 B1 * | 12/2016 | Asnaashari | H03M 13/2906 |
| 9,564,921 B1 | 2/2017 | Graumann et al. | |
| 9,564,922 B1 | 2/2017 | Graumann et al. | |
| 9,602,133 B1 | 3/2017 | Graumann et al. | |
| 9,742,439 B1 | 8/2017 | Graumann | |
| 9,793,924 B1 | 10/2017 | Graumann et al. | |
| 10,230,552 B1 | 3/2019 | Graumann | |
| 10,236,915 B2 | 3/2019 | Graumann et al. | |
| 10,505,707 B2 | 12/2019 | Graumann | |
| 10,700,713 B2 | 6/2020 | Graumann et al. | |
| 10,972,249 B1 | 4/2021 | Graumann | |
| 10,977,118 B2 | 4/2021 | Niu et al. | |
| 11,086,716 B2 | 8/2021 | Graumann | |
| 11,165,443 B2 | 11/2021 | Graumann | |
| 11,398,291 B2 | 7/2022 | Zuolo et al. | |
| 11,514,994 B1 | 11/2022 | Zuolo et al. | |
| 11,663,076 B2 | 5/2023 | Graumann | |
| 2002/0144210 A1 | 10/2002 | Borkenhagen et al. | |
| 2003/0219083 A1 | 11/2003 | Graumann | |
| 2005/0015420 A1 | 1/2005 | Gibb et al. | |
| 2005/0114420 A1 | 5/2005 | Gibb et al. | |
| 2005/0114421 A1 | 5/2005 | Gibb et al. | |
| 2006/0161830 A1 * | 7/2006 | Yedidia | H03M 13/6561 714/758 |
| 2007/0157064 A1 | 7/2007 | Falik et al. | |
| 2008/0002567 A1 | 1/2008 | Bourlas et al. | |
| 2008/0176577 A1 | 7/2008 | Bourlas et al. | |
| 2008/0288569 A1 | 11/2008 | Gibb et al. | |
| 2009/0190465 A1 | 7/2009 | Porat et al. | |
| 2009/0327820 A1 | 12/2009 | Asirvatham et al. | |
| 2010/0037112 A1 | 2/2010 | Graumann | |
| 2011/0176446 A1 | 7/2011 | Bourlas et al. | |
| 2011/0231731 A1 | 9/2011 | Gross et al. | |
| 2011/0242964 A1 | 10/2011 | Porat et al. | |
| 2012/0300873 A1 | 11/2012 | Graumann et al. | |
| 2013/0343495 A1 | 12/2013 | Han et al. | |
| 2014/0040697 A1 | 2/2014 | Loewenstein | |
| 2014/0146605 A1 | 5/2014 | Yang | |
| 2014/0237313 A1 | 8/2014 | Wang et al. | |
| 2015/0074481 A1 | 3/2015 | Graumann | |
| 2015/0100860 A1 | 4/2015 | Lee et al. | |
| 2016/0124679 A1 | 5/2016 | Huang et al. | |
| 2016/0371014 A1 | 12/2016 | Roberts | |
| 2017/0149446 A1 | 5/2017 | Tao et al. | |
| 2017/0263311 A1 | 9/2017 | Cometti | |
| 2018/0005670 A1 | 1/2018 | Lee et al. | |
| 2018/0032282 A1 | 2/2018 | Hahn et al. | |
| 2018/0034483 A1 | 2/2018 | Graumann et al. | |
| 2018/0046541 A1 * | 2/2018 | Niu | G06F 11/1048 |
| 2018/0314586 A1 | 11/2018 | Artieri et al. | |
| 2019/0044539 A1 | 2/2019 | Graumann et al. | |
| 2019/0073139 A1 | 3/2019 | Kim et al. | |
| 2019/0207740 A1 | 7/2019 | Graumann | |
| 2020/0106461 A1 | 4/2020 | Graumann | |
| 2020/0183826 A1 | 6/2020 | Beaudoin et al. | |
| 2020/0184245 A1 | 6/2020 | Huang et al. | |
| 2021/0028795 A1 | 1/2021 | Graumann | |
| 2021/0109673 A1 | 4/2021 | Kim et al. | |
| 2021/0385012 A1 * | 12/2021 | Buethe | H04L 1/0045 |
| 2022/0027083 A1 | 1/2022 | Zuolo et al. | |
| 2022/0050632 A1 | 2/2022 | Hong et al. | |
| 2022/0052710 A1 | 2/2022 | Graumann | |
| 2022/0058488 A1 | 2/2022 | Zuolo et al. | |
| 2022/0116056 A1 | 4/2022 | Kaynak et al. | |
| 2022/0165348 A1 | 5/2022 | Zuolo et al. | |
| 2022/0270698 A1 | 8/2022 | Zuolo et al. | |
| 2022/0329262 A1 | 10/2022 | Liu et al. | |
| 2022/0365845 A1 | 11/2022 | Buch et al. | |
| 2022/0374169 A1 | 11/2022 | Zuolo et al. | |
| 2022/0375532 A1 | 11/2022 | Zuolo et al. | |
| 2022/0382629 A1 | 12/2022 | Graumann | |
| 2022/0383970 A1 | 12/2022 | Zuolo et al. | |
| 2022/0416812 A1 | 12/2022 | Wu | |
| 2023/0087247 A1 | 3/2023 | Li et al. | |
| 2023/0094363 A1 | 3/2023 | Graumann | |

OTHER PUBLICATIONS

J. Mu et al., "The impact of faulty memory bit cells on the decoding of spatially-coupled LDPC codes," 2015 49th Asilomar Conference on Signals, Systems and Computers, Pacific Grove, CA, USA, 2015, pp. 1627-1631, doi: 10.1109/ACSSC .2015.7421423. (Year: 2015), Nov. 2015.

* cited by examiner

```
┌─────────────────────────────────────────────────────────────────────┐
│ RECEIVING A PLURALITY OF SUBSEQUENT DDR BURSTS EACH COMPRISING A    │
│ PLURALITY OF ENCODED SYMBOLS TO DECODE THE FIRST DDR BURST          │
│                              405                                     │
└─────────────────────────────────────────────────────────────────────┘
                                   │
                                   ▼
┌─────────────────────────────────────────────────────────────────────┐
│ DECODING THE PLURALITY OF SUBSEQUENT DDR BURSTS BY EACH OF THE      │
│ PLURALITY OF ECC ERASURE DECODERS AND ACCUMULATING THE NUMBER       │
│ OF EXCESS SYMBOL CORRECTIONS MADE DURING THE DECODING OF THE        │
│ PLURALITY OF SUBSEQUENT DDR BURSTS BY EACH OF THE PLURALITY OF ECC  │
│                         ERASURE DECODERS                             │
│                              410                                     │
└─────────────────────────────────────────────────────────────────────┘
                                   │
                                   ▼
┌─────────────────────────────────────────────────────────────────────┐
│ FOR EACH OF THE PLURALITY OF ECC ERASURE DECODERS RESULTING IN A    │
│ VALID DECODING SOLUTION OF THE SUBSEQUENT DDR BURSTS, IDENTIFYING   │
│ THE ECC ERASURE DECODER HAVING THE FEWEST NUMBER OF EXCESS          │
│ SYMBOL CORRECTIONS ABOVE THE PREDETERMINED EXCESS SYMBOL            │
│ CORRECTION THRESHOLD BASED UPON THE ACCUMULATED NUMBER OF           │
│ EXCESS SYMBOL CORRECTIONS MADE DURING THE DECODING OF THE FIRST     │
│ DDR BURST AND THE SUBSEQUENT DDR BURSTS BY EACH OF THE PLURALITY    │
│ OF ECC ERASURE DECODERS (OPT. FEWEST NUMBER OF EXCESS SYMBOL        │
│ CORRECTIONS IS IN RELATION TO A PREDETERMINED EXCESS SYMBOL         │
│ CORRECTION THRESHOLD AS A MINIMUM REQUIRED DIFFERENCE)              │
│                              415                                     │
└─────────────────────────────────────────────────────────────────────┘
```

FIG. 4

SYSTEM AND METHOD FOR DOUBLE DATA RATE (DDR) CHIP-KILL RECOVERY

CROSS-REFERENCE TO RELATED APPLICATIONS

This application claims priority to U.S. Provisional Patent Application No. 63/180,615, filed Apr. 27, 2021, and entitled "SYSTEM AND METHOD FOR LOW-LATENCY DOUBLE DATE RATE (DDR) CHIP-KILL RECOVERY", which is herein incorporated by reference in its entirety.

BACKGROUND OF THE INVENTION

Double data rate (DDR) memory interfaces are constantly increasing in speed to support higher and higher bandwidths of operation. As the speed of the DDR interface increases and the density of the DDR devices themselves increase, the frequency of bit-errors at the output of the DDR interface also increases. Additionally, DDR interfaces and devices are susceptible to complete failure, wherein a particular die or portion of a die begins reporting completely erroneous data.

When entire devices or "chips" in a DDR memory device fail, known as a chip-kill event, all the information stored on that particular device is lost. Erasure decoding using Reed-Solomon (RS) decoders is known in the art to recover the lost information. RS decoders are commonly used in digital communication systems to detect corrupted data contained in a digital transmission and to correct the corrupted data. RS decoders employ redundancy in the transmitted data, such that upon receipt of the data transmission, the potentially corrupted data and redundancy are processed to correct the corrupted data in the data transmission. However, known RS erasure decoder operations used to recover corrupted data require external information to indicate that a particular portion of the data needs to be erased due to a chip-kill event.

Accordingly, there is a need for a method and apparatus that provides a forward-error correction (FEC) solution for recovering the information from a failed DDR memory device. The FEC solution should be capable of identifying the failing DDR memory device and recovering the information without prior notice of the failure of the DDR memory device and should be capable of recovering the information with low latency.

SUMMARY OF THE INVENTION

In various embodiments, the present invention provides a method and apparatus that employs low latency forward-error correction (FEC) techniques for recovering information from a failed DDR memory device without requiring prior notice of the DDR memory device being in failure.

In one embodiment, a method for double data rate (DDR) chip-kill decoding is provided which includes, receiving, at a DDR interface, a DDR burst comprising a plurality of encoded symbols from a DDR memory device, wherein the DDR memory device comprises a plurality of chips. The method further includes, decoding, at the DDR interface, the DDR burst using an error correction code (ECC) random error decoder. If the decoding of the DDR burst using the ECC random error decoder fails to decode the DDR burst, the method continues by decoding the DDR burst using an ECC chip-kill decoder array comprising a plurality of ECC erasure decoders operating in parallel, wherein each of the plurality of ECC erasure decoders decodes the DDR burst assuming that a different chip of the plurality of chips of the DDR memory device has experienced a chip-kill event. For each of the plurality of ECC erasure decoders resulting in a valid decoding solution, the method continues by identifying a number of excess symbol corrections made during the decoding, wherein the excess symbol corrections are symbol corrections in excess of the symbol corrections made on the assumed erased chip. The method continues by identifying the ECC erasure decoder having a fewest number of excess symbol corrections above a predetermined excess symbol correction threshold and then decoding the DDR burst using the identified ECC erasure decoder having the fewest number of excess symbol corrections above the predetermined excess symbol correction threshold.

Following the identification of the ECC erasure decoder identified as having the fewest number of excess symbol corrections above the predetermined excess symbol correction threshold, the method then continues by using the identified ECC erasure decoder to decode subsequently received DDR bursts from the DDR memory device.

In an additional embodiment, if the ECC erasure decoder having the fewest number of excess symbol corrections above the predetermined excess symbol correction threshold cannot be identified by decoding a first DDR burst using the ECC chip-kill decoder array, the method further includes, receiving a plurality of subsequent DDR bursts each comprising a plurality of encoded symbols to decode the first DDR burst. The method then continues by decoding the plurality of subsequent DDR bursts by each of the plurality of ECC erasure decoders and accumulating the number of excess symbol corrections made during the decoding of the plurality of subsequent DDR bursts by each of the plurality of ECC erasure decoders and for each of the plurality of ECC erasure decoders resulting in a valid decoding solution of the subsequent DDR bursts, identifying the ECC erasure decoder having the fewest number of excess symbol corrections above the predetermined excess symbol correction threshold based upon the accumulated number of excess symbol corrections made during the decoding of the first DDR burst and the subsequent DDR bursts by each of the plurality of ECC erasure decoders.

In a specific embodiment, the ECC random error decoder is a Reed-Solomon (RS) ECC random error decoder and each of the plurality of ECC erasure decoders are Reed-Solomon (RS) ECC erasure decoders.

In an additional embodiment, the present invention provides a double data rate (DDR) chip-kill decoder which includes, an error correction code (ECC) random error decoder to receive a DDR burst comprising a plurality of encoded symbols from a DDR memory device, the DDR memory device comprising a plurality of chips, and an ECC chip-kill decoder array comprising a plurality of ECC erasure decoders to decode the DDR burst when the ECC random error decoder fails to decode the DDR burst, wherein each of the plurality of ECC erasure decoders are to operate in parallel to decode the DDR burst assuming that a different chip of the plurality of chips of the DDR memory device has experienced a chip-kill event. The DDR chip-kill decoder further includes, a decode selection logic circuit to, for each of the plurality of ECC erasure decoders resulting in a valid decoding solution, identify a number of excess symbol corrections made during the decoding, wherein the excess symbol corrections are symbol corrections in excess of the symbol corrections made on the assumed erased chip, identify the ECC erasure decoder having a fewest number of excess symbol corrections above a predetermined excess symbol correction threshold and decode the DDR bust using identified ECC erasure decoder having the fewest number of excess symbol corrections above the predetermined excess symbol correction threshold.

In another embodiment, the present invention provides a memory controller including a double data rate (DDR) interface in communication with one or more DDR memory devices, the DDR interface for receiving a DDR burst comprising a plurality of encoded symbols from the DDR memory device, wherein the DDR memory device comprises a plurality of chips. The memory controller further includes a DDR chip-kill decoder in communication with the DDR interface. The DDR chip-kill decoder includes an error correction code (ECC) random error decoder to receive the DDR burst from the DDR interface, an ECC chip-kill decoder array comprising a plurality of ECC erasure decoders to decode the DDR burst when the ECC random error decoder fails to decode the DDR burst, wherein each of the plurality of ECC erasure decoders operate in parallel to decode the DDR burst assuming that a different chip of the plurality of chips of the DDR memory device has experienced a chip-kill event and a decode selection logic circuit. The decode selection logic circuit to, for each of the plurality of ECC erasure decoders resulting in a valid decoding solution, identify a number of excess symbol corrections made during the decoding by each of the plurality of ECC erasure decoders, wherein the excess symbol corrections are symbol corrections in excess of the symbol corrections made on the erased chip, identify the ECC erasure decoder having a fewest number of excess symbol corrections above a predetermined excess symbol correction threshold and wherein the ECC erasure decoder having the fewest number of excess symbol corrections above a predetermined excess symbol correction threshold is to decode the DDR burst.

In a particular embodiment, the DDR interface of the memory controller may be a DDR4 burst interface or a DDR5 burst interface.

Accordingly, in various embodiments the present invention provides a solution for recovering the information from a failed DDR memory device. The solution is capable of recovering the information from the failed DDR memory device without prior notice of the failure of the DDR memory device and with low latency.

BRIEF DESCRIPTION OF THE DRAWINGS

The accompanying drawings, which are incorporated in and form part of this specification, illustrate various examples, and together with the Detailed Description of the Invention, serve to explain principles discussed below. The drawings referred to in this brief description should not be understood as being drawn to scale unless specifically noted.

DETAILED DESCRIPTION OF THE INVENTION

Reference will now be made in detail to various embodiments, examples of which are illustrated in the accompanying drawings. While various embodiments are discussed herein, it will be understood that they are not intended to be limiting. On the contrary, the presented embodiments are intended to cover alternatives, modifications, and equivalents, which may be included within the spirit and scope of the various embodiments as defined by the appended claims. Furthermore, in this Detailed Description of the Invention, numerous specific details are set forth in order to provide a thorough understanding. However, embodiments may be practiced without one or more of these specific details. In other instances, well known methods, procedures, components, and circuits have not been described in detail as not to unnecessarily obscure aspects of the described embodiments.

It will be understood that, although the terms first, second, third, without limitation, may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Entire devices, commonly referred to as "chips", in a DDR memory device can fail, resulting in all the information stored on that DDR chip being lost. Such a failure is commonly referred to as a "chip-kill". A chip-kill in a double data rate (DDR) memory device generally corresponds to a complete failure of a single chip or to a single chip that exceeds a threshold number of bit errors. The presence of a chip-kill in a memory device may cause a large number of the bits associated with the failed chip to provide erroneous data over a large number of bursts during a memory transaction.

Solutions for chip-kill events are known to utilize the Reed-Solomon (RS) family of error correction codes (ECCs). Such codes divide information into symbols of "m" bits in size. In a particular embodiment, the symbol may be comprised of 8 bits (m=8). For RS decoding, any number of bit errors within a given symbol is still considered a single symbol error. For example, for m=8, a symbol with 1 bit flipped is a single error and a symbol with all 8 bits flipped is also considered to be a single error. This property of RS decoders is a useful for recovering information where significant sections of the memory block may be in error, as would be the case in a chip-kill event.

Another property of RS decoding is that if an error location in the DDR memory device is known, then that location can be marked as being in error or can be marked as erased. RS decoders can correct twice the number of erased symbols, i.e. symbols marked as being in error or erased, as compared to the case where no error location information is known. For example, if an RS decoder can correct 4 random symbols in error, it can correct 8 known symbols in error. Random symbol correction and erasures can also be used in any valid combination where t=2*R+E, wherein t is correction capacity based on the parity of the encoded symbols, R is random error count and E is the erased error count. Standard Reed-Solomon (RS) erasure operations require external information to indicate that a particular portion of the data needs to be erased. Information from a known failed device needs to be erased. By erasing, the random symbol corrections (R) are converted to erased errors (E). An RS decoder can recover twice the number of erased errors (E) compared to random symbol corrections (R). For operation in DDR, an indication from an external source indicating that a particular chip has failed would be required in order for the RS decoder to have the correction capacity (t) for decoding increased as compared to having random errors. When such indications are not available for failed devices, one must determine the chip-kill location using other means.

Figure 1:
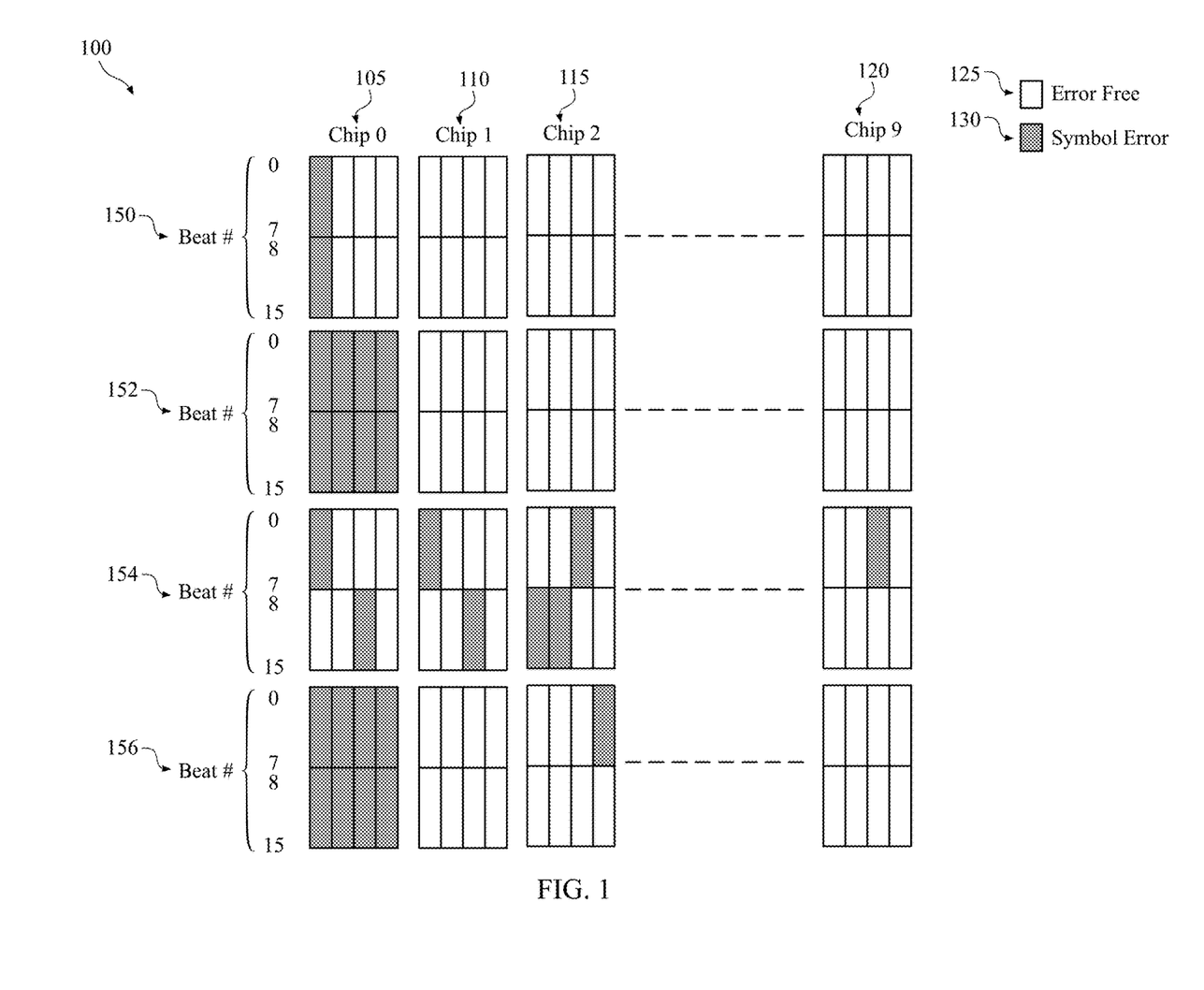
FIG. 1 illustrates an exemplary DDR device comprising a plurality of chips having multiple symbol errors requiring correction, in accordance with an example of the present invention.

With reference to FIG. 1, a DDR memory device may comprise a plurality of chips 105, 110, 115, . . . 120. For a DDR5 memory device, there are 4 bits for each chip for each beat and 16 beats in each burst. In this embodiment, for a standard RS decoder with a parity of 16 and m=8, up to 8 random errors and up to 16 erased errors can be corrected. As indicated above, the term erased errors includes know error locations. As such, in a first burst 150 there are 2 8-bit symbol errors in a single chip, and these errors can be corrected with the standard RS decoder that can correct up to 8 random symbols in error. In a second burst 152, a chip-kill event has occurred on chip 0 105 resulting in 8 symbol errors. These symbol errors can also be corrected with the standard RS decoder that can correct up to 8 random symbols in error. In a third burst 154, there are 8 symbol errors spread across 4 chips. These errors are also correctable with a standard RS decoder that can correct up to 8 random symbols in error. However, in a fourth burst 156, a chip-kill event has occurred on chip 0 105, resulting in 8 symbol errors, and an additional symbol error has occurred on chip 2 115. These errors are not correctable with a standard RS decoder that is capable of correcting up to 8 random symbols in error because there are a total of 9 random symbol errors in burst 156.

The present invention provides a solution for correcting the symbol errors in the fourth burst 156 of FIG. 1 by identifying the chip-kill event of chip 0 105.

Figure 2:
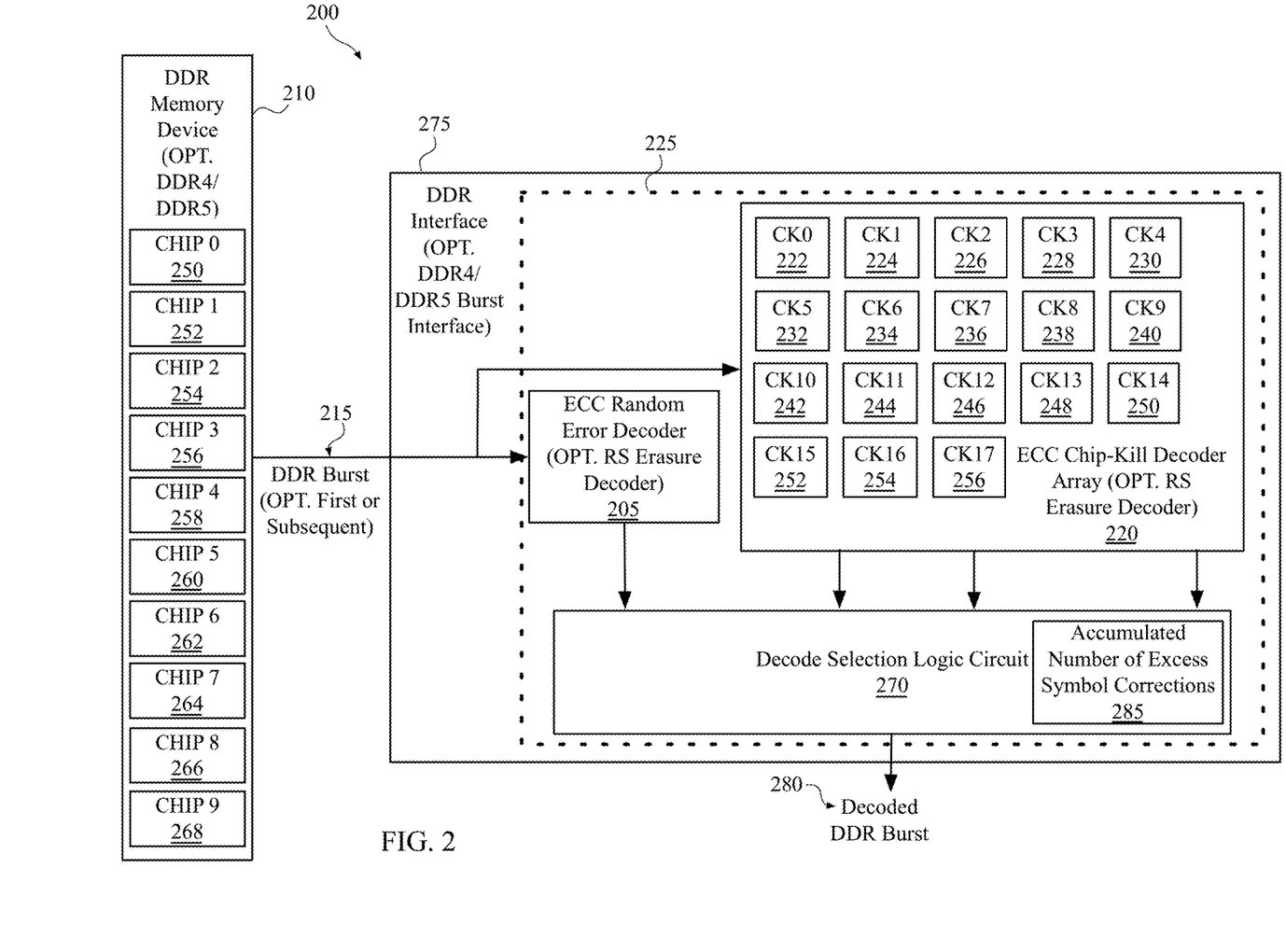
FIG. 2 illustrates a memory controller including a DDR interface having a DDR chip-kill decoder, in accordance with an example of the present invention.

In accordance with the present invention, a solution is provided which implements an array of erasure decoders operating in parallel, one for each chip of the DDR memory device. A comparison of the results from each of the erasure decoders of the erasure decoder array is then made to identify the chip-kill location. Accordingly, embodiments of the present invention can detect when a single chip of a DDR memory device has failed, with low latency and without requiring foreknowledge of the location of the failed chip on the memory device. Additionally, operating in parallel with the erasure decoders is an ECC random error decoder 205 that is also considered when selecting the correct decoder output to be utilized. The solution allows for determination of the chip-kill location on the same burst where the first chip-kill event takes place.

A memory controller 200 including a DDR interface 275 having a DDR chip-kill decoder 225 is illustrated in FIG. 2. The DDR interface 275 is in communication with a DDR memory device 210 comprising a plurality of chips 250, 252, 254, 256, 258, 260, 262, 264, 266, 268. The DDR memory device 210 may be a DDR4 or a DDR 5 memory device and the DDR interface 275 may be a DDR4 or DDR 5 burst interface.

The DDR chip-kill decoder 225 includes an ECC random error decoder 205, an ECC chip-kill decoder array 220 comprising a plurality of ECC erasure decoders 222, 224, 226, 228, 230, 232, 234, 236, 238, 240, 242, 244, 246, 248, 250, 252, 254, 256 and a decode selection logic circuit 270 coupled to the ECC chip-kill decoder array 220 and to the ECC random error decoder 205.

In a particular embodiment, the ECC random error decoder 205 is a Reed-Solomon (RS) ECC random error decoder and the ECC erasure decoders 222, 224, 226, 228, 230, 232, 234, 236, 238, 240, 242, 244, 246, 248, 250, 252, 254, 256 may be Reed-Solomon (RS) decoder capable of erasure decoding, wherein the ECC erasure decoders are capable of erasing all of the information from one failed device while still providing some capability to correct excess symbol corrections.

Excess symbol corrections are defined as the error corrections made by the ECC erasure decoders in addition to the erased portion of the memory block. Recall that the correction capacity of an ECC erasure decoder based on the parity of encoded symbols t for a memory block is determined as, t=2*R+E, where R is the number of random error symbols (excess symbol corrections in this context) and E is the number of erasures. As such, R and E can be any combination less than or equal to the number of parity symbols in the memory block, t. The excess symbol correction capability of each ECC erasure decoder determines the correction ECC erasure decoder to select for subsequent decoding.

In operation of the DDR chip-kill decoder 225, the ECC random error decoder 205 receives a DDR burst 215 comprising a plurality of encoded symbols from the DDR memory device 210. The ECC random error decoder 205 attempts to decode the DDR burst 215 received from the DDR memory device 210. If the ECC random error decoder 205 is successful in decoding the DDR burst 215, the result is the decoded DDR burst 280 and is passed to the output by Decode Selection Logic Circuit 270. If the ECC random error decoder 205 fails to decode the DDR burst 215, the plurality of ECC erasure decoders 222, 224, 226, 228, 230, 232, 234, 236, 238, 240, 242, 244, 246, 248, 250, 252, 254, 256 of the ECC chip-kill decoder array 220 attempt to decode the DDR burst 215 in parallel, wherein each of the plurality of ECC erasure decoders 222, 224, 226, 228, 230, 232, 234, 236, 238, 240, 242, 244, 246, 248, 250, 252, 254, 256 assumes that a different chip of the plurality of chips 250, 252, 254, 256, 258, 260, 262, 264, 266, 268 of the DDR memory device 210 has experienced a chip-kill event. The DDR chip-kill decoder 225 marks all the information from the DDR memory device experiencing a chip-kill event as being erased in future decoding operations. Marking the erasure indicates to the DDR chip-kill decoder 225 which symbols are known to be in error, significantly improving the correction capabilities of the DDR chip-kill decoder 225.

The ECC random error decoder 205 fails to decode the DDR burst 215 when a number of symbol errors in the DDR burst 215 is greater than a symbol correction capacity of the ECC random error decoder 205. For example, referring again to FIG. 1, the ECC random error decoder 205 would fail to decode burst 156 because there are 9 symbol errors in burst 156, which exceeds the maximum 8 symbol correction capacity of the ECC random error decoder 205.

During decoding or attempting to decode the DDR burst, the ECC erasure decoders 222, 224, 226, 228, 230, 232, 234, 236, 238, 240, 242, 244, 246, 248, 250, 252, 254, 256 attempt to recover the real information from the DDR burst 215. The results of the decoding may be a valid decode, a failed decode or even a false decode. So, for one skilled in the art, and throughout this document, the term "decoding" does not necessarily imply a decode success, but generally refers to an attempt to recover the data burst using a particular decoding algorithm or process.

Following the decoding of the DDR burst 215 by the plurality of ECC erasure decoders 222, 224, 226, 228, 230, 232, 234, 236, 238, 240, 242, 244, 246, 248, 250, 252, 254, 256, for each of the plurality of ECC erasure decoders 222, 224, 226, 228, 230, 232, 234, 236, 238, 240, 242, 244, 246, 248, 250, 252, 254, 256 resulting in a valid decoding solution, the decode selection logic circuit 270 identifies a number of excess symbol corrections made during the decoding, wherein the excess symbol corrections are symbol corrections in excess of the symbol corrections made on the assumed erased chip.

Referring again to FIG. 1, upon receiving burst 156 at the ECC chip-kill decoder array 220, if ECC erasure decoder 222 of the ECC chip-kill decoder array 220 assumes that chip 0 105 has experienced a chip-kill event, and therefore considers chip 0 an erased chip, then the number of excess symbol corrections in excess of the symbol corrections made on the assumed erased chip (chip 0 105) is equal to 1. Alternatively, if ECC erasure decoder 224 of the chip-kill decoder array 220 assumes that chip 1 110 has experienced a chip-kill event, and therefore considers chip 0 205 to not be an erased chip, then the number of excess symbol corrections in excess of the symbol corrections made on the assumed erased chip (chip 1 110) is equal to 9. Essentially, an ECC erasure decoder of the plurality of ECC erasure decoders 222, 224, 226, 228, 230, 232, 234, 236, 238, 240, 242, 244, 246, 248, 250, 252, 254, 256 that assumes the correct location of a chip-kill event will result in a lower number of excess symbol corrections, relative to the other ECC erasure decoders.

Following the identification of the number of excess symbol corrections made during the decoding of the DDR burst 115 at each of the plurality of ECC erasure decoders 222, 224, 226, 228, 230, 232, 234, 236, 238, 240, 242, 244, 246, 248, 250, 252, 254, 256, the decode selection logic circuit then identifies the ECC erasure decoder of the plurality of ECC erasure decoders 222, 224, 226, 228, 230, 232, 234, 236, 238, 240, 242, 244, 246, 248, 250, 252, 254, 256 having a fewest number of excess symbol corrections. In one example the term "fewest number" is in relation to a predetermined excess symbol correction threshold. The predetermined excess symbol correction threshold may be set based upon a desired correction capability of the DDR interface 275.

Considering a case where a chip has experienced a chip-kill event, for example second burst 152, and assuming a total of 10 ECC erasure decoders, each of the plurality of ECC erasure decoders 222, 224, 226, 228, 230, 232, 234, 236, 238, 240 are operated in parallel, each assuming that a different chip is the chip that has experienced the chip-kill event. Each of the ECC erasure decoders 222, 224, 226, 228, 230, 232, 234, 236, 238, 240 decodes the DDR burst and returns a number of excess symbol corrections. While one of the ECC erasure decoders has performed the decoding assuming the correct chip-kill location, the other 9 ECC erasure decoders have performed the decoding assuming a chip, other than the chip that actually experienced the chip-kill event, has experienced a chip-kill event. The ECC erasure decoder that assumed that correct chip-kill location will not use any excess symbol corrections during the decoding because there are no random errors to correct. The decoding by the other 9 ECC erasure decoders will result in invalid solutions. Some of the invalid solutions will result in no solution, while other invalid solutions will result in a large number of excess symbol corrections. The predetermined excess symbol correction threshold defines the number of excess symbol corrections by which a best solution must be better than a $2^{nd}$ best solution, to be considered the ECC erasure decoder that has assumed the correct chip-kill location. Letting $R_n$ be the number of excess symbol corrections for each of the ECC erasure decoders, where n goes from 1 to the number of ECC erasure decoders in ECC chip-kill decoder array 220. If min2(Rn)−min (Rn)>=predetermined excess symbol correction threshold then, the output from the decoder corresponding to min (Rn) is selected. Here min is the simple min function, while min2 returns the $2^{nd}$ min from a set (the $2^{nd}$ lowest value).

The predetermined excess symbol correction threshold prevents erroneous data from being transmitted from any of the ECC erasure decoders of the ECC chip-kill decoder array 220. When the number of errors at an ECC erasure decoder exceeds the correction capability of the ECC erasure decoder, the most likely outcome is that the ECC erasure decoder indicates that it does not have a solution. This most likely outcome can be easily filtered in the selection process. However, it is also possible for the ECC erasure decoder to result in a false decode, wherein the ECC erasure decoder indicates that it has a solution that is a mathematical solution that satisfies all the equations within the decoder, but the result does not represent the actual encoded packet. A false decode result must be filtered out of the selection process to prevent erroneous data from entering the system. The predetermined excess symbol correction threshold may be set in the field to tune the selection criteria specific to the unique characteristics of any system to filter out the false decode and prevent the transmission of erroneous data into the system. In general, for a false decode, all the excess symbol correction capacity (E in t=2*R+E) of the ECC erasure decoder is typically used, whereas for a correct decode, very little of the excess symbol correction capacity (E) of the ECC erasure decoder is typically used. In a particular example, where the excess symbol correction capacity is (E) is equal to 4, as is the case in a DDR5 system, the ECC erasure decoder with the correct decode will almost always use 0 excess symbol corrections and an ECC erasure decoder resulting in a false decode will almost always use 4 excess symbol corrections. The likelihood of the number of excess symbol corrections being between 0 and 4 for each of the ECC erasure decoders is dependent upon various factors including a background error rate of the system itself, excess error probability distributions of the ECC erasure decoders and data integrity requirements of the system. The predetermined excess symbol correction threshold may be set based upon knowledge of the factors to provide for filtering of any false decode results which may result in erroneous data being transmitted.

After the ECC erasure decoder of the plurality of ECC erasure decoders 222, 224, 226, 228, 230, 232, 234, 236, 238, 240, 242, 244, 246, 248, 250, 252, 254, 256 having the fewest number of excess symbol corrections has been identified, the DDR burst 215 is decoded using the identified ECC erasure decoder having the fewest number of excess symbol corrections. The result of the decoding is the decoded DDR burst 280.

Following the identification of the ECC erasure decoder having the fewest number of excess symbol corrections, decoding of subsequent DDR bursts from the DDR memory device 210 is performed using the ECC erasure decoder identified as having the fewest number of excess symbol corrections and the ECC random error decoder 205 in parallel.

Additionally, the DDR chip-kill decoder 225 reduces the latency associated with identifying a chip-kill event by operation of the plurality of ECC erasure decoders 222, 224, 226, 228, 230, 232, 234, 236, 238, 240, 242, 244, 246, 248, 250, 252, 254, 256 in parallel, and in parallel with ECC random error decoder 205, each assuming a different chip of the DDR memory device 210 has experienced a chip-kill event.

The DDR chip-kill decoder 225 may operate in one of several different modes, including 10 chip and 9 chip DDR5 as well as 18 chip DDR4 operation. As shown in FIG. 2, the ECC chip-kill decoder array 220 may include up to 18 erasure decoders 222, 224, 226, 228, 230, 232, 234, 236, 238, 240, 242, 244, 246, 248, 250, 252, 254, 256 for DDR4 operation. Alternatively, some of the erasure decoders can be eliminated for DDR5 operation. For example, only ECC erasure decoders 222, 224, 226, 228, 230, 232, 234, 236, 238 could be implemented in a 9 chip DDR 5 solution or only ECC erasure decoders 222, 224, 226, 228, 230, 232, 234, 236, 238, 240 could be implemented in a 10 chip DDR 5 solution. It should also be noted that the ECC erasure decoders 222, 224, 226228, 230, 232, 234, 236, 238, 240, 242, 244, 246, 248, 250, 252, 254, 256 of the ECC chip-kill decoder array 220 may be significantly smaller than the ECC random error decoder 205. For example, the symbol correction capacity of the ECC random error decoder 205 may be greater than the symbol correction capacity of each of the plurality of ECC erasure decoders 222, 224, 226, 228, 230, 232, 234, 236, 238, 240, 242, 244, 246, 248, 250, 252, 254, 256. However, if a chip-kill event has occurred on a device that is being decoded by the ECC random error decoder 205, the ECC random error decoder 205 may be unable to decode the burst due to the limited symbol correction capacity of the ECC random error decoder 205. In various situations, the ECC random error decoder 205 may be unable to decode the burst or may be able to decode the burst, but with zero excess symbol corrections capability. The use of the ECC chip-kill decoder array 220 in combination with the ECC random error decoder 205 allows for the correction of a chip-kill event while still providing some excess symbol correction capability.

Excess correction is the random error correction capacity of the Reed-Solomon (RS) code after the erased chip-kill locations have been taken into account. The more excess correction capacity, the more robustly the correct chip-kill location can be determined. In cases where the excess capacity is small, the DDR chip-kill decoder 225 may need to process several subsequent bursts exhibiting the chip-kill event to correctly identify the chip-kill location. For example, if the decode selection logic circuit 260 is unable to identify the ECC erasure decoder of the plurality of ECC erasure decoders 222, 224, 226, 228, 230, 232, 234, 236, 238, 240, 242, 244, 246, 248, 250, 252, 254, 256 having the fewest number of excess symbol corrections by decoding the encoded symbols of a first DDR burst, the decode selection logic circuit may receive a plurality of subsequent DDR bursts 215, each comprising a plurality of encoded symbols following the failure of the ECC random error decoder 205 to successfully decode the encoded symbols. The subsequent DDR bursts 215 may then be decoded by each of the plurality of ECC erasure decoders 222, 224, 226, 228, 230, 232, 234, 236, 238, 240, 242, 244, 246, 248, 250, 252, 254, 256 and the number of excess symbol corrections made during the decoding of the plurality of subsequent DDR bursts 215 by each of the plurality of ECC erasure decoders may be accumulated 285. Following the accumulation, for each of the plurality of ECC erasure decoders 222, 224, 226, 228, 230, 232, 234, 236, 238, 240, 242, 244, 246, 248, 250, 252, 254, 256 resulting in a valid decoding solution of the subsequent DDR bursts 215, the ECC erasure decoder having the fewest number of excess symbol corrections may be identified based upon the accumulated number of excess symbol corrections 285 made during the decoding of the first DDR burst 215 and the subsequent DDR bursts 215 by each of the plurality of ECC erasure decoders 222, 224, 226, 228, 230, 232, 234, 236, 238, 240, 242, 244, 246, 248, 250, 252, 254, 256. As indicated above, in one example the term "fewest number" is in relation to a predetermined excess symbol correction threshold as a minimum required difference.

Figure 3A:
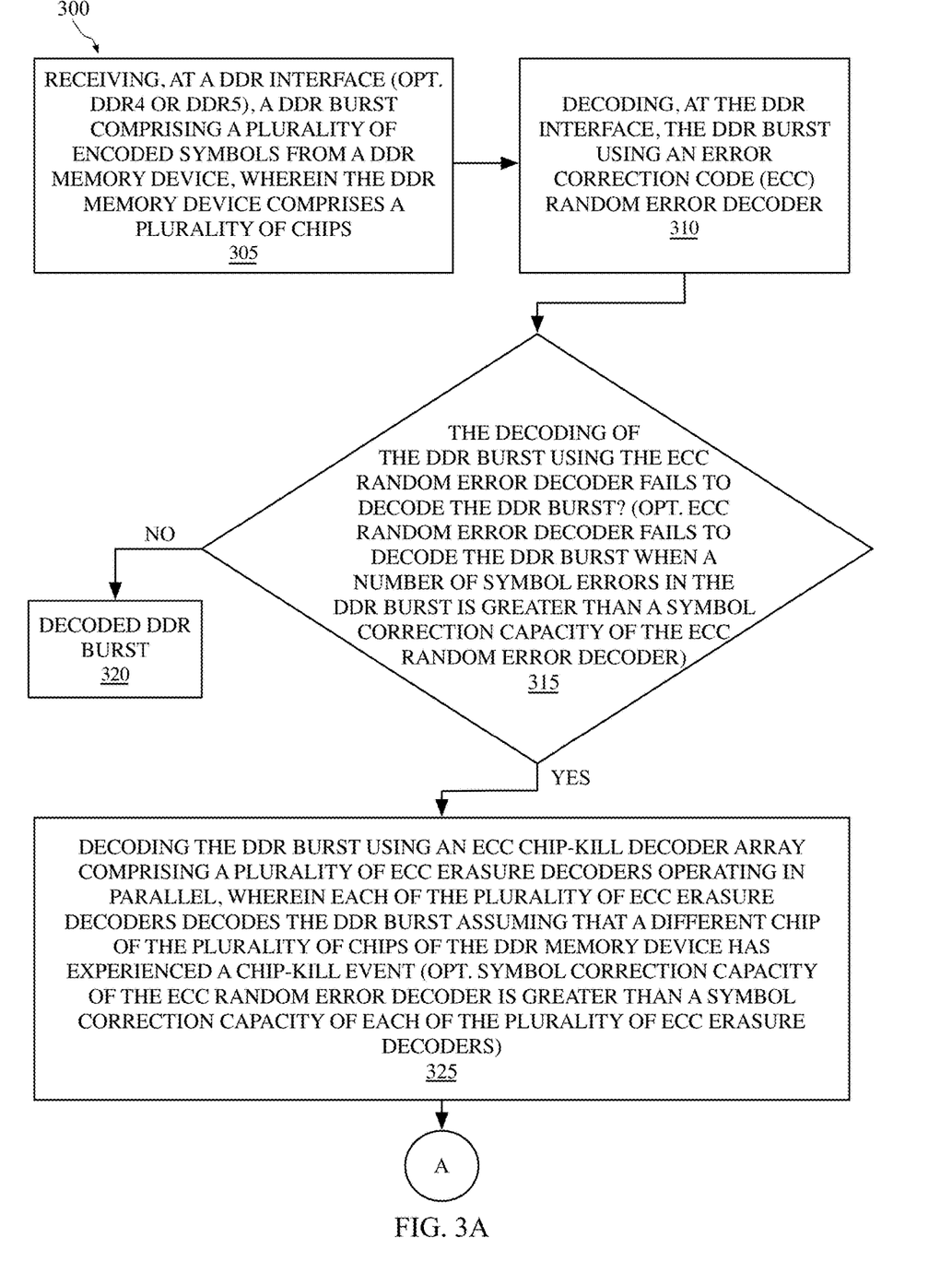
FIG. 3A illustrates a first flow diagram of a method for performing double data rate (DDR) chip-kill decoding, in accordance with an example of the present invention.
Figure 3B:
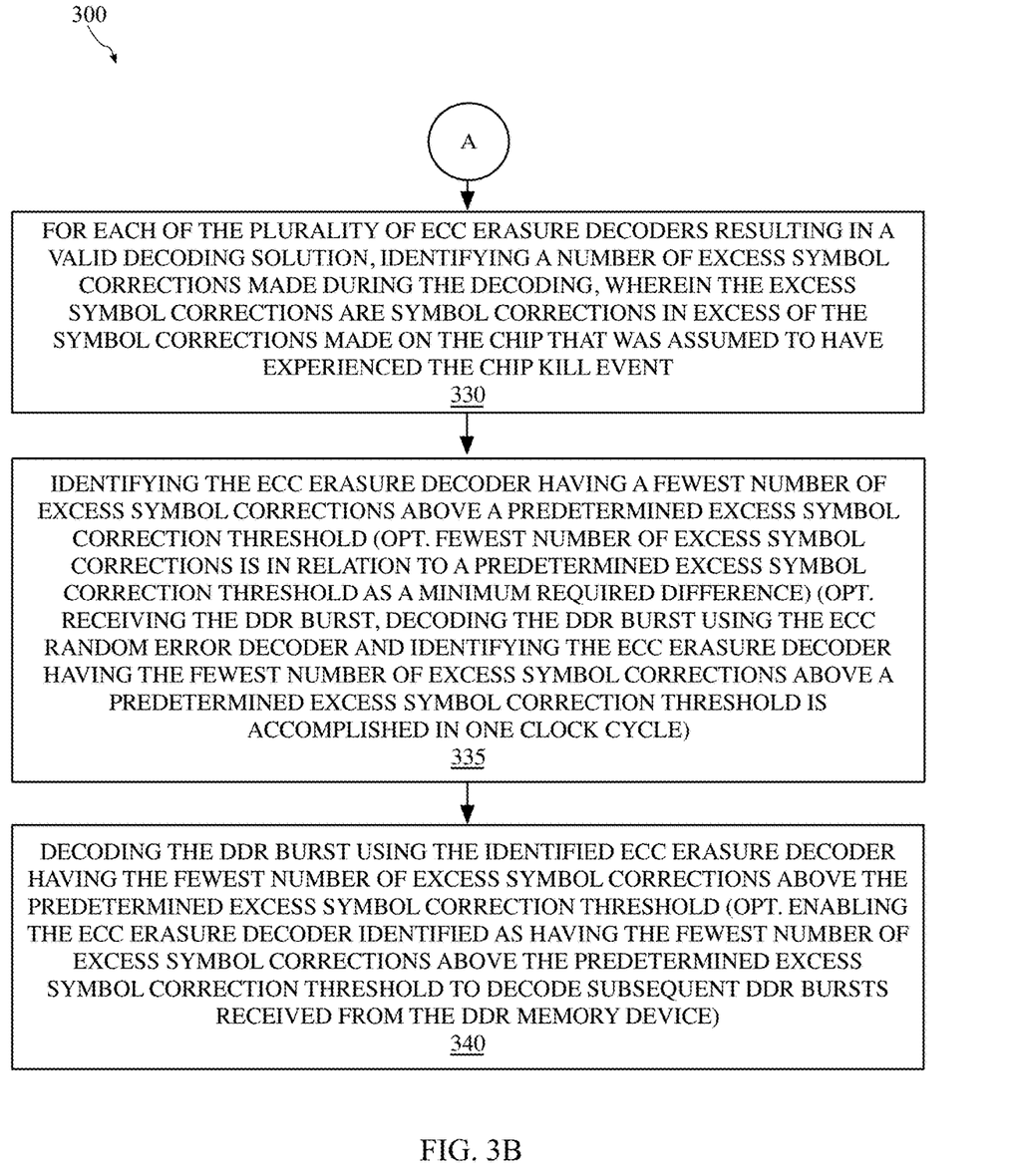
FIG. 3B is a second flow diagram that is a continuation of the flow diagram of FIG. 3A illustrating the method for performing DDR chip-kill decoding, in accordance with an example of the present invention.

FIG. 3A and FIG. 3B, in combination, illustrate a flow diagram of a method 300 for performing double data rate (DDR) chip-kill decoding, in accordance with an embodiment of the present invention.

At operation 305 of FIG. 3A, the method 300 includes receiving, at a DDR interface, a DDR burst comprising a plurality of encoded symbols from a DDR memory device, wherein the DDR memory device comprises a plurality of chips. With reference to FIG. 2, a DDR burst 215 comprising a plurality of encoded symbols from a DDR memory device 210 is received at a DDR interface 275.

At operation 310, the method continues by decoding, at the DDR interface, the DDR burst using an error correction code (ECC) random error decoder. With reference to FIG. 2, a ECC random error decoder 205 of the DDR interface 275 decodes the DDR burst 215.

At operation 315, if the decoding of the DDR burst using the ECC random error decoder performed at operation 310 fails to decode the DDR burst, the method continues at operation 325 by decoding the DDR burst using an ECC chip-kill decoder array comprising a plurality of ECC erasure decoders operating in parallel, wherein each of the plurality of ECC erasure decoders decodes the DDR burst assuming that a different chip of the plurality of chips of the DDR memory device has experienced a chip-kill event. In particular, the ECC random error decoder fails to decode the DDR burst when a number of symbol errors in the DDR burst is greater than a symbol correction capacity of the ECC random error decoder. In a specific embodiment, the symbol correction capacity of the ECC random error decoder is greater than a symbol correction capacity of each of the plurality of ECC erasure decoders of the ECC chip-kill decoder array. Alternatively, if at operation 315, the decoding of the DDR burst using the ECC random error decoder does not fail to decode the DDR burst, then the ECC random error decoder provides a decoded DDR burst at operation 320. With reference to FIG. 2, if the ECC random error decoder 205 fails to decode the DDR burst 215, an ECC chip-kill decoder array 220 decodes the DDR burst 215, wherein each of the plurality of ECC erasure decoders 222, 224, 226, 228, 230, 232, 234, 236, 238, 240, 242, 244, 246, 248, 250, 252, 254, 256 of the ECC chip-kill decoder array 220 decodes the DDR burst 215 assuming that a different chip of the plurality of chips 250, 252, 254, 256, 258, 260, 262, 264, 266, 268 of the DDR memory device 210 has experienced a chip-kill event. Alternatively, if the ECC random error decoder 205 is successful in decoding the DDR burst 215, a decoded DDR burst 280 is provided by the ECC random error decoder 205.

Following the decoding of the DDR burst using the plurality of ECC erasure decoders of the ECC chip-kill decoder array, the method 300 continues at operation 330 of FIG. 3B wherein, for each of the plurality of ECC erasure decoders resulting in a valid decoding solution, identifying a number of excess symbol corrections made during the decoding, wherein the excess symbol corrections are symbol corrections in excess of the symbol corrections made on the assumed erased chip. With reference to FIG. 2, the decode selection logic circuit 270 identifies the number of excess symbol corrections made during the decoding by the plurality of ECC erasure decoders 222, 224, 226, 228, 230, 232, 234, 236, 238, 240, 242, 244, 246, 248, 250, 252, 254, 256 of the ECC chip-kill decoder array 220, wherein the excess symbol corrections are symbol corrections in excess of the symbol corrections made on the assumed erased chip 250, 252, 254, 256, 258, 260, 262, 264, 266, 268 of the DDR memory device 210.

Following the identification of the number of excess symbol corrections made during the decoding by the plurality of ECC erasure decoders, the method 300 then continues at operation 335 by identifying the ECC erasure decoder having the fewest number of excess symbol corrections. As indicated above, in one example the term "fewest number" is in relation to a predetermined excess symbol correction threshold as a minimum required difference. With reference to FIG. 2, the decode selection logic circuit 270 includes circuitry to compare the number of excess symbol corrections made by each of the plurality of ECC erasure decoders 222, 224, 226, 228, 230, 232, 234, 236, 238, 240, 242, 244, 246, 248, 250, 252, 254, 256 and to identify the ECC erasure decoder of the plurality of ECC erasure decoders 222, 224, 226, 228, 230, 232, 234, 236, 238, 240, 242, 244, 246, 248, 250, 252, 254, 256 that has the fewest number of excess symbol corrections above a predetermined excess symbol correction threshold. When a chip-kill event occurs, the ECC random error decoder 205 will either provide a match with one of the existing ECC erasure decoders 222, 224, 226, 228, 230, 232, 234, 236, 238, 240, 242, 244, 246, 248, 250, 252, 254, 256, wherein the random error correction capability of the ECC random error decoder 205 is sufficient to decode a burst from the device experiencing a chip-kill event and there are no additional errors, a decode failure, when no solution is available, or a decode result with very high excess symbol correction. A match occurs between the ECC random error decoder 205 and one of the existing ECC erasure decoders 222, 224, 226, 228, 230, 232, 234, 236, 238, 240, 242, 244, 246, 248, 250, 252, 254, 256 when the ECC random error decoder 205 is capable of correcting all the errors from the chip-kill event independently. In this case, the ECC random error decoder 205 and the ECC erasure decoder will return the same solution, i.e., the same symbols are corrected to the same values. The possible results from the ECC random error decoder 205 are filtered within 270, along with the results of the decoding from each of the ECC erasure decoders 222, 224, 226, 228, 230, 232, 234, 236, 238, 240, 242, 244, 246, 248, 250, 252, 254, 256. The results from the ECC random error decoder 205 and the excess symbol corrections from each of the ECC erasure decoders 222, 224, 226, 228, 230, 232, 234, 236, 238, 240, 242, 244, 246, 248, 250, 252, 254, 256 are filtered by the decode selection logic circuit 270 to arrive at a single output, i.e., decoded DDR burst 280.

The decode selection logic circuit 270 filters the results from the ECC random error decoder 205 and the excess symbol corrections from each of the ECC erasure decoders 222, 224, 226, 228, 230, 232, 234, 236, 238, 240, 242, 244, 246, 248, 250, 252, 254, 256 by selecting the ECC random error decoder 205 as the decoded DDR burst 280 if the ECC random error decoder 205 is capable of decoding the burst or if a match occurs between the ECC random error decoder 205 and one of the existing ECC erasure decoders 222, 224, 226, 228, 230, 232, 234, 236, 238, 240, 242, 244, 246, 248, 250, 252, 254, 256. If the ECC random error decoder cannot decode the burst, the decode selection logic circuit 270 selects the ECC erasure decoder having the fewest number of excess symbol corrections above the predetermined excess symbol correction threshold. If the decode selection logic circuit 270 is unable to select a clear winner from the ECC erasure decoders 222, 224, 226, 228, 230, 232, 234, 236, 238, 240, 242, 244, 246, 248, 250, 252, 254, 256, the ECC erasure decoders most likely to result in a decode solution in the future are identified and future burst decodes are used to learn the correct chip-kill decoder over time, with the assistance of firmware for tracking the training steps.

In particular, if a first ECC erasure decoder results in 2 excess symbol corrections and a second ECC erasure decoder results in 3 excess symbol corrections, the decode selection logic circuit 270 may be unable to select a clear winner. In this situation, since decoding subsequent memory blocks will tend to exhibit the same correct chip-kill location (i.e., the first ECC erasure decoder will always be in the pool of possible solutions), future decodes are filtered based upon where previous chip-kill decodes have been successful and where the fewest accumulated excess errors occur until the decode selection logic circuit 270 is able to select a winner. For example, a subsequent decode with the first ECC erasure decoder would likely result in a decode solution with 0 excess symbol corrections and a subsequent decode with the second ECC erasure decoder would likely result in a decode failure (i.e., 4 excess symbol corrections) resulting in only one chip-kill location having a mathematical solution for the memory block, which would be selected by the decode selection logic circuit 270 as the winner. Alternatively, if the same two memory blocks are involved in the next chip-kill, there will be a total of 2 excess symbol corrections for the first ECC erasure decoder (2 from the first decode and 0 from the second decode) and a total of 7 excess symbol corrections for the second ECC erasure decoder (3 from the first decode and 4 from the second decode). The differential between the accumulated excess symbol corrections of the first ECC erasure decoder and the second ECC erasure decoder is now 5, instead of 1 when only considering the first block decode. Given this high excess symbol correction differential, the decode selection logic circuit 270 can confidently select the first ECC erasure decoder as the winner.

At operation 340, the method 300 concludes by decoding the DDR burst using the identified ECC erasure decoder having the fewest number of excess symbol corrections above the predetermined excess symbol correction threshold. With reference to FIG. 2, the DDR burst 215 is decoded using the ECC erasure decoder of the plurality of ECC erasure decoders 222, 224, 226, 228, 230, 232, 234, 236, 238, 240, 242, 244, 246, 248, 250, 252, 254, 256 identified by the decode selection logic circuit 260 as having the fewest number of excess symbol corrections. As indicated above, in one example the term "fewest number" is in relation to a predetermined excess symbol correction threshold as a minimum required difference. The result of the decoding of the DDR burst 215 is a decoded DDR burst 280. Additionally, the ECC erasure decoder identified as having the fewest number of excess symbol corrections above the predetermined excess symbol correction threshold is enabled to decode subsequent DDR bursts received from the DDR memory device. With reference to FIG. 2, the ECC erasure decoder of the plurality of ECC erasure decoders 222, 224, 226, 228, 230, 232, 234, 236, 238, 240, 242, 244, 246, 248, 250, 252, 254, 256 identified by the decode selection logic circuit 260 as having the fewest number of excess symbol corrections is used to decoded subsequent DDR bursts from the DDR memory device 210.

Once a chip has been identified as experience a chip-kill event, the ECC erasure decoder identified by the decode selection logic circuit 260 as having the fewest number of excess symbol corrections is used to decode subsequent bursts. It is no longer necessary to decode using the ECC random error decoder 205 or the other ECC erasure decoders. While the other ECC erasure decoders may be used for decoding to gather statistical information regarding the number of excess symbol corrections, the results are not considered in the decode selection logic circuit 270 tuned to that failed device. If another device experiences a chip-kill while a selected one of the ECC erasure decoders is being used for decoding, then all the information is considered lost because the DDR chip-kill decoder 225 can survive one device in failure, but not two.

Figure 4:
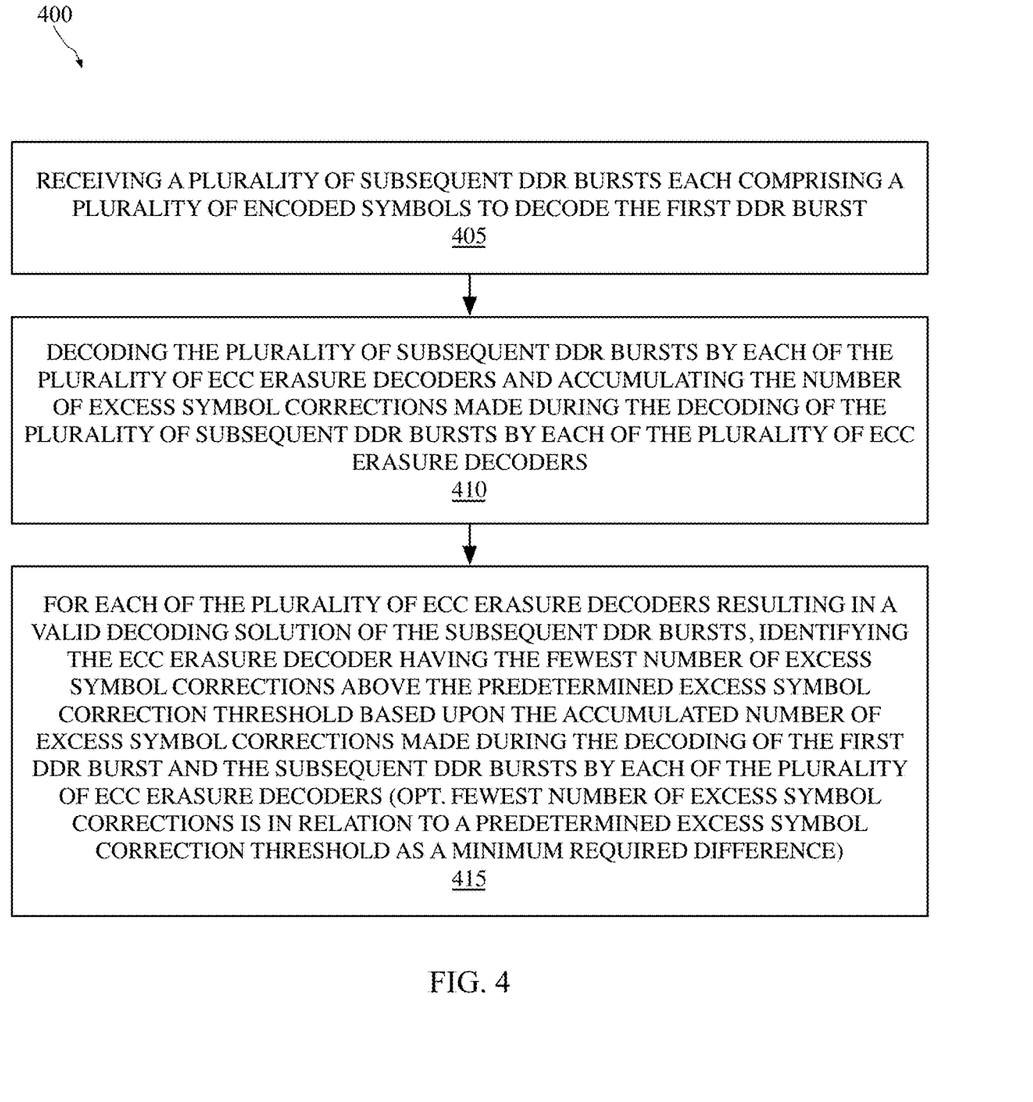
FIG. 4 illustrates a flow diagram of a method for performing double data rate (DDR) chip-kill decoding if the ECC erasure decoder having the fewest number of excess symbol corrections above the predetermined excess symbol correction threshold cannot be identified by decoding a first DDR burst using the ECC chip-kill decoder array.

FIG. 4 illustrates a flow diagram of a method 400 for performing double data rate (DDR) chip-kill decoding if the ECC erasure decoder having the fewest number of excess symbol corrections above the predetermined excess symbol correction threshold cannot be identified by decoding a first DDR burst using the ECC chip-kill decoder array.

The method 400 begins at operation 405 by receiving a plurality of subsequent DDR bursts each comprising a plurality of encoded symbols to decode the first DDR burst. With reference to FIG. 2, a plurality of subsequent DDR bursts 215 from the DDR memory device 210 may be received by the ECC random error decoder 205 and the ECC chip-kill decoder array 220 following the failure of the ECC random error decoder 205 to decode the first DDR burst.

At operation 410, the method 400 continues by decoding the plurality of subsequent DDR bursts by each of the plurality of ECC erasure decoders and accumulating the number of excess symbol corrections made during the decoding of the plurality of subsequent DDR bursts by each of the plurality of ECC erasure decoders. With reference to FIG. 2, the plurality of subsequent DDR bursts 215 are decoded by each of the plurality of ECC erasure decoders 222, 224, 226, 228, 230, 232, 234, 236, 238, 240, 242, 244, 246, 248, 250, 252, 254, 256 of the ECC chip-kill decoder array 220 and the number of excess symbol corrections made during the decoding of the plurality of subsequent DDR bursts are accumulated 285 at the decode selection logic circuit 270.

In particular, if the ECC erasure decoder having the fewest number of excess symbol corrections cannot be identified by decoding a first DDR burst using the ECC chip-kill decoder array because the excess symbol corrections at two or more of the ECC erasure decoders are not different by the predetermined excess symbol correction threshold, the excess symbol corrections are accumulated over different bursts at different times to determine the correct chip-kill location. The ECC erasure decoder assuming the correct chip-kill location will consistently return very low excess symbol corrections while an ECC erasure decoder assuming an incorrect chip-kill location will return either no-solution or a solution with high excess symbol corrections. As the excess corrections are accumulated for each ECC erasure decoder. If only one ECC erasure decoder provides a valid solution (i.e., all other ECC erasure decoders indicate decode failure) or if one solution has the lowest number of errors, i.e., better than all others by at least the predetermined excess symbol correction threshold, and only one solution provides a valid CRC (if applicable) then there is a clear winner. The other solutions, if any, are discarded.

The method 400 concludes at operation 415, wherein for each of the plurality of ECC erasure decoders resulting in a valid decoding solution of the subsequent DDR bursts, identifying the ECC erasure decoder having the fewest number of excess symbol corrections based upon the accumulated number of excess symbol corrections made during the decoding of the first DDR burst and the subsequent DDR bursts by each of the plurality of ECC erasure decoders. As indicated above, in one example the term "fewest number" is in relation to a predetermined excess symbol correction threshold as a minimum required difference. With reference to FIG. 2, for each of the plurality of ECC erasure decoders 222, 224, 226, 228, 230, 232, 234, 236, 238, 240, 242, 244, 246, 248, 250, 252, 254, 256 of the ECC chip-kill decoder array 220 resulting in a valid decoding solution of the subsequent DDR bursts 215, the ECC erasure decoder having the fewest number of excess symbol corrections is identified based upon the accumulated number of excess symbol corrections 285 made during the decoding of the first DDR burst and the subsequent DDR bursts by each of the plurality of ECC erasure decoders 222, 224, 226, 228, 230, 232, 234, 236, 238, 240, 242, 244, 246, 248, 250, 252, 254, 256.

The solution will generally recover a chip-kill event without any prior notice of the location on the first burst where the chip-kill event initiated. If the solution is not found on the first burst, the excess symbol corrections can be accumulated, as described above, until a solution is found. The solution will operate automatically without any firmware assistance, in most circumstances. In some instances, firmware assistance may be needed to track between different blocks during the accumulation process if a solution is not found on a first burst. In an example implementation, the determination of the location of the chip-kill is done in hardware, since it has all the information available for a given burst and in a timely manner. As such, a low-latency solution is provided that minimizes the loss of data and minimizes firmware interaction with the decoder.

In one embodiment, the low-latency DDR chip-kill decoder may be implemented in an integrated circuit as a single semiconductor die.

In various embodiments, portions of the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, a network processor, a microcontroller or general-purpose computer.

What is claimed is:

1. A method for double data rate (DDR) chip-kill decoding, the method comprising:

receiving, at a DDR interface, a DDR burst comprising a plurality of encoded symbols from a DDR memory device, wherein the DDR memory device comprises a plurality of chips;

decoding, at the DDR interface, the DDR burst using an error correction code (ECC) random error decoder;

wherein the ECC random error decoder fails to decode the DDR burst and in response:

decoding the DDR burst using an ECC chip-kill decoder array comprising a plurality of ECC erasure decoders operating in parallel, wherein respective ECC erasure decoders of the plurality of ECC erasure decoders decodes the DDR burst assuming that a different chip of the plurality of chips of the DDR memory device has experienced a chip-kill event, in response to the decoding the DDR burst using an ECC chip-kill decoder array respective ones of the plurality of ECC erasure decoders generating a valid decoding solution to correct a number of random error symbols and to correct an erased portion of the memory block that corresponds to the chip assumed to have experienced a chip-kill event;

identifying a number of excess symbol corrections for the respective ones of the plurality of ECC erasure decoders generating a valid decoding solution wherein the identified number of excess symbol corrections is the number of random error symbol corrections made by the respective ECC ersure decoder during the decoding of the DDR burst;

identifying an ECC erasure decoder of the plurality of ECC erasure decoders having a fewest number of excess symbol corrections; and     selecting for output a decoded DDR burst from the identified ECC erasure decoder having the fewest number of excess symbol corrections.

2. The method of claim 1, wherein the fewest number of excess symbol corrections is in relation to a predetermined excess symbol correction threshold as a minimum required difference.

3. The method of claim 1, comprising enabling the ECC erasure decoder identified as having the fewest number of excess symbol corrections to decode subsequent DDR bursts received from the DDR memory device.

4. The method of claim 1, wherein if the ECC erasure decoder having the fewest number of excess symbol corrections cannot be identified by decoding a first DDR burst using the ECC chip-kill decoder array, the method comprising:

receiving a plurality of subsequent DDR bursts comprising a plurality of encoded symbols;

decoding the plurality of subsequent DDR bursts at respective ones of the plurality of ECC erasure decoders and accumulating a number of excess symbol corrections made during the decoding of the plurality of subsequent DDR bursts at respective ones of the plurality of ECC erasure decoders; and     for respective ones of the plurality of ECC erasure decoders resulting in a valid decoding solution of the subsequent DDR bursts, identifying an ECC erasure decoder of the plurality of ECC erasure decoders having the fewest number of excess symbol corrections based upon the accumulated number of excess symbol corrections made during the decoding of the first DDR burst and the plurality of subsequent DDR burst.

5. The method of claim 4, wherein the fewest number of excess symbol corrections is in relation to a predetermined excess symbol correction threshold as a minimum required difference.

6. The method of claim 1, wherein the ECC random error decoder is a Reed-Solomon ECC random error decoder.

7. The method of claim 1, wherein respective ones of the plurality of ECC erasure decoders are Reed-Solomon ECC erasure decoders.

8. The method of claim 1, wherein a symbol correction capacity of the ECC random error decoder is greater than a symbol correction capacity of respective ones of the plurality of ECC erasure decoders.

9. The method of claim 1, wherein the DDR interface is a DDR4 interface or a DDR5 interface.

10. A double data rate (DDR) chip-kill decoder comprising:

an error correction code (ECC) random error decoder to receive a DDR burst comprising a plurality of encoded symbols from a DDR memory device, the DDR memory device comprising a plurality of chips;

an ECC chip-kill decoder array comprising a plurality of ECC erasure decoders to decode the DDR burst when the ECC random error decoder fails to decode the DDR burst, wherein respective ECC erasure decoders of the plurality of ECC erasure decoders are to operate in parallel to decode the DDR burst assuming that a different chip of the plurality of chips of the DDR memory device has experienced a chip-kill event, in response to the decoding the DDR burst using the ECC chip-kill decoder array respective ones of the plurality of ECC erasure decoder to generate a valid decoding solution to correct a number of random error symbols and to correct an erased portion of the memory block that corresponds to the chip assumed to have experienced a chip-kill event; and     a decode selection logic circuit to:

identify a number of excess symbol corrections for respective ones of the plurality of ECC erasure decoders generatinf a valid decoding solution, wherein the identified number of excess symbol corrections is number of random error symbol corrections made by the respective ECC erasure decoder diring the decoding of the DDR burst,         identify an ECC erasure decoder of the plurality of ECC erasure decoders having a fewest number of excess symbol corrections, and         select for output a decoded DDR burst from the ECC random error decoder when the decoding of the DDR burst using the ECC random error decoder does not fail to decode the DDR burst, or a decoded DDR burst from the identified ECC erasure decoder having the fewest number of excess symbol corrections when the decoding of the DDR burst using the ECC random error decoder fails to decode the DDR burst.

11. The DDR chip-kill decoder of claim 10, wherein the fewest number of excess symbol corrections is in relation to a predetermined excess symbol correction threshold as a minimum required difference.

12. The DDR chip-kill decoder of claim 10, wherein the ECC erasure decoder identified as having the fewest number of excess symbol corrections is to decode subsequent DDR bursts received from the DDR memory device.

13. The DDR chip-kill decoder of claim 10, wherein if the decode selection logic circuit is unable to identify the ECC erasure decoder having the fewest number of excess symbol corrections by decoding the encoded symbols of a first DDR burst, the decode selection logic circuit is to:
    receive a plurality of subsequent DDR bursts comprising a plurality of encoded symbols;
    decode the plurality of subsequent DDR bursts at respective ones of the plurality of ECC erasure decoders and accumulate a number of excess symbol corrections made during the decoding of the plurality of subsequent DDR bursts; and
    for respective ones of the plurality of ECC erasure decoders resulting in a valid decoding solution of the subsequent DDR bursts, identify an ECC erasure decoder of the plurality of ECC erasure decoders having the fewest number of excess symbol corrections based upon the accumulated number of excess symbol corrections made during the decoding of the first DDR burst and the plurality of subsequent DDR bursts by respective ones of the plurality of ECC erasure decoders.

14. The DDR chip-kill decoder of claim 10, wherein the ECC random error decoder is a Reed-Solomon ECC random error decoder.

15. The DDR chip-kill decoder of claim 10, wherein respective ones of the plurality of ECC erasure decoders are Reed-Solomon ECC erasure decoders.

16. The DDR chip-kill decoder of claim 10, wherein a symbol correction capacity of the ECC random error decoder is greater than a symbol correction capacity of respective ones of the plurality of ECC erasure decoders.

17. A memory controller comprising:
    a double data rate (DDR) interface in communication with one or more DDR memory devices, the DDR interface for receiving a DDR burst comprising a plurality of encoded symbols from the one or more DDR memory devices, wherein the one or more DDR memory devices comprises a plurality of chips;
    a DDR chip-kill decoder in communication with the DDR interface, the DDR chip-kill decoder comprising:
        an error correction code (ECC) random error decoder to receive the DDR burst from the DDR interface;
        an ECC chip-kill decoder array comprising a plurality of ECC erasure decoders to decode the DDR burst, wherein respective ones of the plurality of ECC erasure decoders are to operate in parallel to decode the DDR burst assuming that a different chip of the plurality of chips of the one or more DDR memory devices has experienced a chip-kill event in response to the decoding the DDR burst using the ECC chip-kill decoder array respective ones of the plurality of ECC erasure decoders to generate a valid decoding solution to correct a number of random error symbols and to correct an erased portion of the memory block that corresponds to the chip assumed to have experienced a chip-kill event; and
    a decode selection logic circuit to:
        identify a number of excess symbol corrections for the respective ones of the plurality of ECC erasure decoders generating a valid decoding solution wherein the identified number of excess symbol corrections in the number of random error symbol corrections made by the respective ECC erasure decoder during the decoding of the DDR burst,
        identify an ECC erasure decoder of the plurality of ECC erasure decoders having a fewest number of excess symbol corrections, and
        select for output a decoded DDR burst from the ECC random error decoder when the decoding of the DDR burst using the ECC random error decoder does not fail to decode the DDR burst or a decoded DDR burst from the identified ECC erasure decoder having the fewest number of excess symbol corrections when the decoding of the DDR burst using the ECC random error decoder fails to decode the DDR burst.

18. The memory controller of claim 17, wherein the fewest number of excess symbol corrections is in relation to a predetermined excess symbol correction threshold as a minimum required difference.

19. The memory controller of claim 17, wherein the DDR interface is a DDR4 burst interface or a DDR5 burst interface.

20. The memory controller of claim 17, wherein the ECC random error decoder is a Reed-Solomon ECC random error decoder and respective ones of the plurality of ECC erasure decoders are Reed-Solomon ECC erasure decoders.

* * * * *

UNITED STATES PATENT AND TRADEMARK OFFICE
CERTIFICATE OF CORRECTION

Page 1 of 1

PATENT NO. : 12,014,068 B2
APPLICATION NO. : 17/671423
DATED : June 18, 2024
INVENTOR(S) : Peter John Waldemar Graumann It is certified that error appears in the above-identified patent and that said Letters Patent is hereby corrected as shown below:

In the Claims

Claim 1, Column 15, Line 29, replace "ersure" with --erasure--.
Claim 4, Column 15, Line 67, replace "burst" with --bursts--.
Claim 10, Column 16, Line 33, replace "decoder" with --decoders--.
Claim 10, Column 16, Line 41, replace "generatinf" with --generating--.
Claim 10, Column 16, Line 43, replace "number" with --a number--.
Claim 10, Column 16, Line 45, replace "diring" with --during--.
Claim 17, Column 18, Line 16, replace "corrections in" with --corrections is--.

Signed and Sealed this
Twenty-seventh Day of August, 2024

Katherine Kelly Vidal
*Director of the United States Patent and Trademark Office*